United States Patent
Wang et al.

(10) Patent No.: US 10,553,591 B2
(45) Date of Patent: Feb. 4, 2020

(54) SEMICONDUCTOR MEMORY DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Ying-Chiao Wang, Changhua County (TW); Li-Wei Feng, Kaohsiung (TW); Chien-Ting Ho, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

(*) Notice: Subject to any disclaimer, the term of this patent is extended or adjusted under 35 U.S.C. 154(b) by 0 days.

(21) Appl. No.: 16/294,934

(22) Filed: Mar. 7, 2019

(65) Prior Publication Data
US 2019/0206874 A1 Jul. 4, 2019

Related U.S. Application Data

(62) Division of application No. 15/884,399, filed on Jan. 31, 2018, now Pat. No. 10,276,577.

(30) Foreign Application Priority Data

Feb. 3, 2017 (CN) .......................... 2017 1 0063706

(51) Int. Cl.
*H01L 29/76* (2006.01)
*H01L 29/94* (2006.01)
*H01L 27/108* (2006.01)

(52) U.S. Cl.
CPC .. *H01L 27/10885* (2013.01); *H01L 27/10805* (2013.01); *H01L 27/10888* (2013.01);
(Continued)

(58) Field of Classification Search
CPC ............. H01L 29/665; H01L 21/28518; H01L 21/28052; H01L 21/823835;
(Continued)

(56) References Cited

U.S. PATENT DOCUMENTS 9,401,275 B2 7/2016 Akasaki
2013/0049103 A1 2/2013 Schloesser
(Continued)

OTHER PUBLICATIONS

Feng, Title of Invention: Semiconductor Device, U.S. Appl. No. 15/452,746, filed Mar. 8, 2017.

*Primary Examiner* — Theresa T Doan
(74) *Attorney, Agent, or Firm* — Winston Hsu

(57) ABSTRACT

A semiconductor memory device and a manufacturing method thereof are provided. At least one bit line structure including a first metal layer, a bit line capping layer, and a first silicon layer located between the first metal layer and the bit line capping layer is formed on a semiconductor substrate. A bit line contact opening penetrating the bit line capping layer is formed for exposing a part of the first silicon layer. A first metal silicide layer is formed on the first silicon layer exposed by the bit line contact opening. A bit line contact structure is formed in the bit line contact opening and contacts the first metal silicide layer for being electrically connected to the bit line structure. The first silicon layer in the bit line structure may be used to protect the first metal layer from being damaged by the process of forming the metal silicide layer.

6 Claims, 11 Drawing Sheets

(52) U.S. Cl.
CPC .. *H01L 27/10894* (2013.01); *H01L 27/10897* (2013.01); *H01L 27/10855* (2013.01)

(58) Field of Classification Search
CPC ......... H01L 27/10894; H01L 27/10897; H01L 27/10802; H01L 27/1104; H01L 27/11524; H01L 27/124
USPC ........................................................ 257/384
See application file for complete search history.

(56) References Cited

U.S. PATENT DOCUMENTS

| | | | | |
|---|---|---|---|---|
| 2014/0021521 A1* | 1/2014 | Lim | ........................ | H01L 29/94 257/296 |
| 2015/0333069 A1* | 11/2015 | Kim | .................. | H01L 27/10814 257/334 |

* cited by examiner

_US 10,553,591 B2_

SEMICONDUCTOR MEMORY DEVICE

CROSS REFERENCE TO RELATED APPLICATIONS

This application is a division of application Ser. No. 15/884,399 filed on Jan. 31, 2018, now allowed, which is incorporated by reference herein in its entirety.

BACKGROUND OF THE INVENTION

1. Field of the Invention

The present invention relates to a semiconductor memory device and a manufacturing method thereof, and more particularly, to a semiconductor memory device having a bit line structure and a manufacturing method thereof.

2. Description of the Prior Art

Dynamic random access memory (DRAM) is a kind of volatile storage device which is an indispensable key part of many electronic products. DRAM includes a great number of memory cells arranged for forming an array configured to store data. Each of the memory cells may be composed of a metal oxide semiconductor (MOS) transistor and a capacitor connected in series.

The MOS transistors of the memory cells may have different structural design because of the product specification and/or the memory cell density requirements. Therefore, the structure of the MOS transistor of the memory cell may be different from that of transistors on other regions within the same chip, and the manufacturing process will become more complicated. Accordingly, it is very important for the related field to effectively integrate the manufacturing process of the MOS transistors in the memory cell and the manufacturing process of the transistors in other regions.

SUMMARY OF THE INVENTION

The present invention provides a semiconductor memory device and a manufacturing method thereof, a first silicon layer is formed between a first metal layer and a bit line capping layer of a bit line structure, and the first silicon layer is used to protect the first metal layer from being damaged by the process of forming a metal silicide layer.

An embodiment of the present invention provides a manufacturing method of a semiconductor memory device, including the following steps. First, a semiconductor substrate is provided. At least one bit line structure is formed on the semiconductor substrate. The bit line structure includes a first metal layer, a bit line capping layer, and a first silicon layer. The bit line capping layer is disposed on the first metal layer, and the first silicon layer is disposed between the first metal layer and the bit line capping layer. At least one bit line contact opening is formed, and the bit line contact opening penetrates the bit line capping layer and exposes at least a portion of the first silicon layer. A first metal silicide layer is formed on the portion of the first silicon layer exposed by the bit line contact opening. A bit line contact structure is formed in the bit line contact opening, and the bit line contact structure contacts the first metal silicide layer for being electrically connected to the bit line structure.

An embodiment of the present invention provides a semiconductor memory device including a semiconductor substrate, at least one bit line structure, at least one bit line contact opening, a first metal silicide layer and a bit line contact structure. The bit line structure is disposed on the semiconductor substrate, and the bit line structure includes a first metal layer, a bit line capping layer, and a first silicon layer. The bit line capping layer is disposed on the first metal layer, and the first silicon layer is disposed between the first metal layer and the bit line capping layer. The bit line contact opening penetrates the bit line capping layer, the first metal silicide layer is disposed on the first silicon layer corresponding to the bit line contact opening, and the bit line contact opening exposes at least a portion of the first metal silicide layer. The bit line contact structure is disposed in the bit line contact opening, and the bit line contact structure contacts the first metal silicide layer for being electrically connected to the bit line structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-11 are schematic diagrams illustrating a manufacturing method of a semiconductor memory device according to an embodiment of the present invention, wherein:

FIG. 2 is a schematic drawing illustrating a fabricating stage subsequent to FIG. 1;

FIG. 3 is a schematic drawing illustrating a fabricating stage subsequent to FIG. 2;

FIG. 4 is a schematic drawing illustrating a storage node contact in the fabricating stage of FIG. 3;

FIG. 5 is a schematic drawing illustrating a fabricating stage subsequent to FIG. 3;

FIG. 6 is a schematic drawing illustrating a fabricating stage subsequent to FIG. 5;

FIG. 7 is a schematic drawing illustrating the storage node contact in the fabricating stage of FIG. 6;

FIG. 8 is a schematic drawing illustrating a fabricating stage subsequent to FIG. 6;

FIG. 9 is a schematic drawing illustrating the storage node contact in the fabricating stage of FIG. 8;

FIG. 10 is a schematic drawing illustrating a fabricating stage subsequent to FIG. 8; and FIG. 11 is a schematic drawing illustrating the storage node contact in the fabricating stage of FIG. 10.

DETAILED DESCRIPTION

Figure 1:
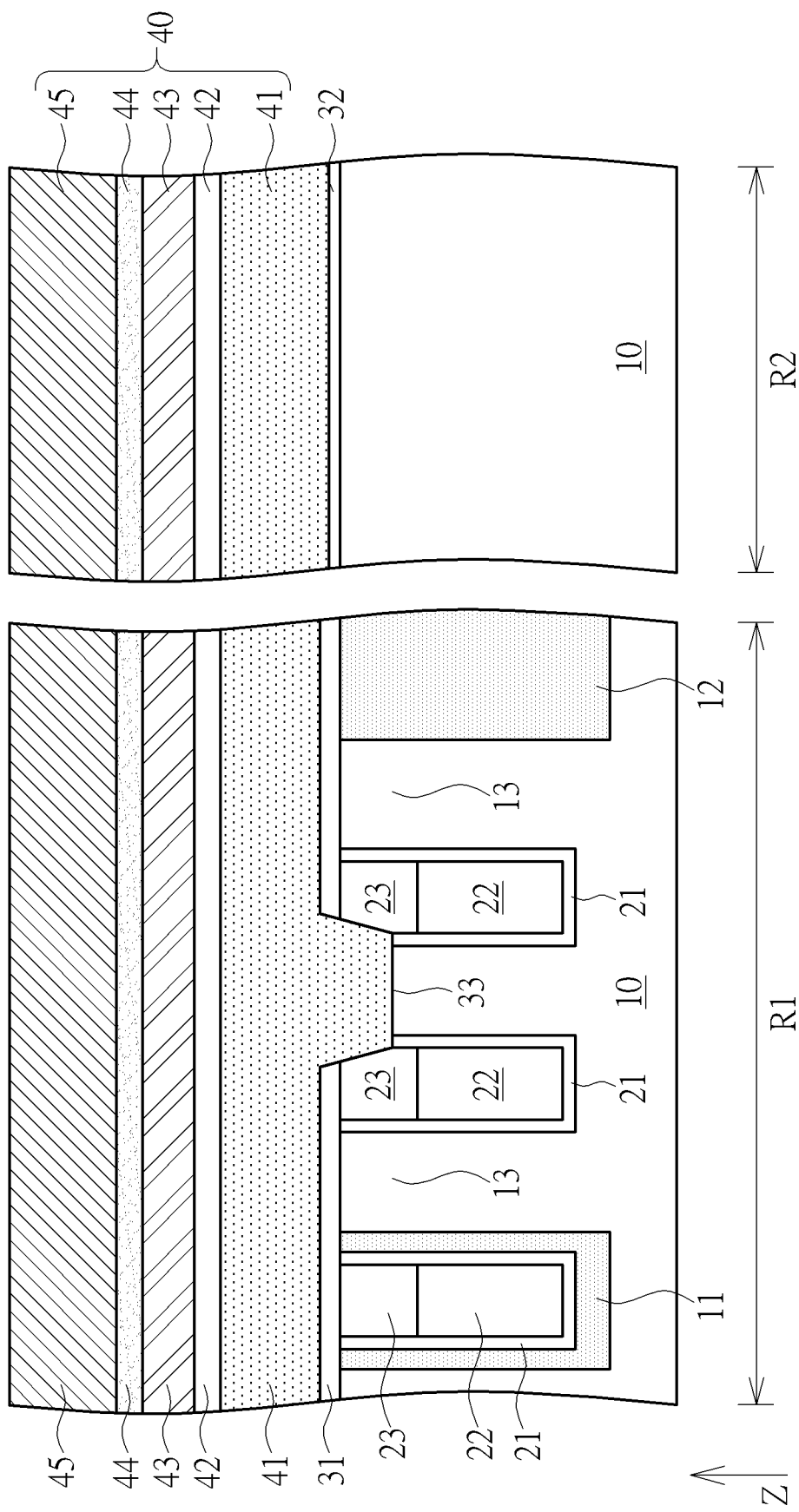

Please refer to FIGS. 1-11. FIGS. 1-11 are schematic diagrams illustrating a manufacturing method of a semiconductor memory device according to an embodiment of the present invention. This embodiment provides a manufacturing method of a semiconductor memory device, including the following steps. First, as shown in FIG. 1, a semiconductor substrate 10 is provided, and a memory cell region R1 and a peripheral region R2 can be defined on the semiconductor substrate 10. The memory cell region R1 is used for forming a plurality of memory cells therein, and the peripheral region R2 is used for forming devices other than the memory cells, such as transistors that can control the signal transmitting of word lines and/or bit lines, but not limited thereto. The semiconductor substrate 10 may include a silicon substrate, an epitaxial silicon substrate, a silicon germanium substrate, a silicon carbide substrate or a silicon-on-insulator (SOI) substrate, but not limited thereto. In this embodiment, a shallow trench isolation 11 may be formed in the memory cell region R1 of the semiconductor substrate 10 for defining a plurality of active regions 13 in the memory cell region R1 of the semiconductor substrate 10. The memory cell region R1 and the peripheral region R2 can be isolated from each other by forming a trench isolation 12 therebetween in the semiconductor substrate 10. The shallow trench isolation 11 and the trench isolation 12 may be formed by using etching method to form a plurality of trenches in the semiconductor substrate 10 and followed by filling the trenches with an insulation material, such as silicon oxide, but not limited thereto. In some embodiments, the shallow trench isolation 11 and the trench isolation 12 may be formed by other suitable methods based on other considerations. Furthermore, a plurality of word lines 22 may be formed in the memory cell region R1 of the semiconductor substrate 10, and each word line 22 of this embodiment may be a buried word line, but not limited thereto. The word lines 22 may be formed in the semiconductor substrate 10 and the shallow trench isolation 11 by using burying method. A word line dielectric layer 21 may be formed between each word line 22 and the semiconductor substrate 10, and a word line capping layer 23 may be formed on each word line 22 to cover each word line 22. The above mentioned word line dielectric layer 21, word lines 22 and word line capping layer 23 may be formed through forming a plurality of trenches in the semiconductor substrate 10 and the shallow trench isolation 11 first and then sequentially forming the word line dielectric layer 21, the word lines 22 and the word line capping layer 23 in the trenches, but not limited thereto. In some embodiments, the word line dielectric layer 21 may include silicon oxide or other suitable dielectric materials, the word lines 22 may include aluminum (Al), tungsten (W), copper (Cu), titanium aluminide (TiAl) or other suitable conductive materials, and the word line capping layer 23 may include silicon nitride, silicon oxynitride, silicon carbon nitride (SiCN) or other suitable insulation materials.

Figure 2:
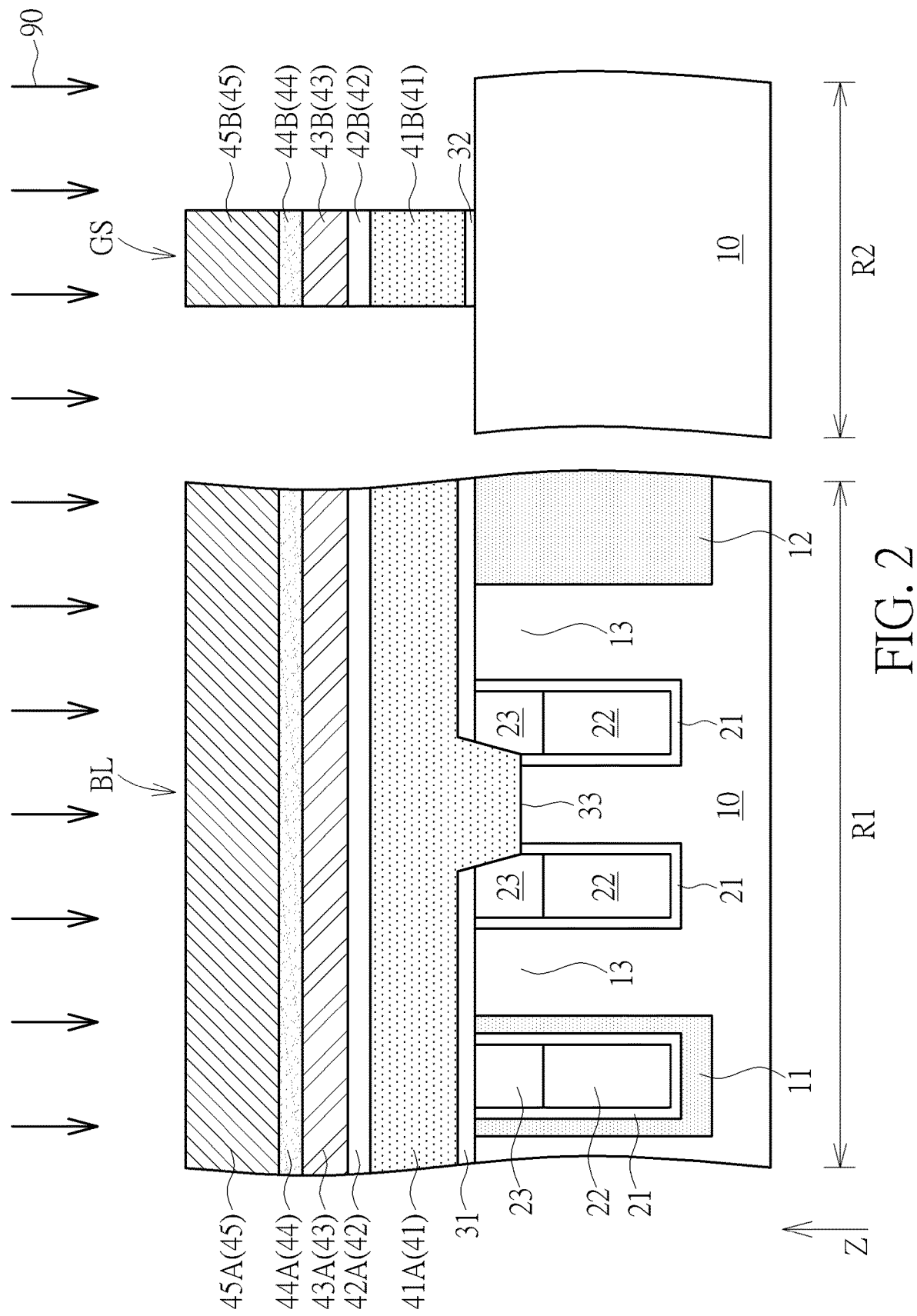

Next, as shown in FIG. 1 and FIG. 2, at least one bit line structure BL is formed on the semiconductor substrate 10. The bit line structure BL includes a first metal layer 43A, a bit line capping layer 45A and a first silicon layer 44A. The bit line capping layer 45A is disposed on the first metal layer 43A, and the first silicon layer 44A is disposed between the first metal layer 43A and the bit line capping layer 45A in a perpendicular direction Z perpendicular to the semiconductor substrate 10. The method of forming the bit line structure BL in this embodiment can include but not limited to the following steps. First, as shown in FIG. 1, a multilayer stack structure 40 is formed on the semiconductor substrate 10, and the multilayer stack structure 40 includes a metal layer 43, a silicon layer 44 and a capping layer 45. The silicon layer 44 is formed on the metal layer 43, and the capping layer 45 is formed on the silicon layer 44. The metal layer 43 may include aluminum, tungsten, copper, titanium aluminide or other suitable conductive material with low resistance. The silicon layer 44 may include polysilicon, amorphous silicon or other suitable silicon containing conductive materials. The capping layer 45 may include silicon nitride, silicon oxynitride, silicon carbon nitride or other suitable insulation materials. Next, as shown in FIG. 2, a patterning process 90 is performed to the multilayer stack structure 40 for forming the bit line structure BL. Specifically, the first metal layer 43A in the bit line structure BL can be formed by performing the patterning process 90 to the metal layer 43 in the multilayer stack structure 40, the first silicon layer 44A can be formed by performing the patterning process 90 to the silicon layer 44 in the multilayer stack structure 40, and the bit line capping layer 45A can be formed by performing the patterning process 90 to the capping layer 45 in the multilayer stack structure 40. In addition, an insulating layer 31 can be formed on the semiconductor substrate 10 before forming the multilayer stack structure 40 to cover the word line capping layers 23, the shallow trench isolation 11 and the active regions 13. An active region opening 33 can be formed to penetrate the insulating layer 31 and expose a portion of the corresponding active region 13. The multilayer stack structure 40 may be formed on the insulating layer 31 and in the active region opening 33, so that the bit line structure BL formed subsequently can contact and electrically connect to the corresponding active region 13.

Additionally, the multilayer stack structure 40 can be formed in the memory cell region R1 and the peripheral region R2, and the bit line structure BL is at least partially formed in the memory cell region R1. Furthermore, the manufacturing method of this embodiment may further include forming at least one gate structure GS in the peripheral region R2. The gate structure GS can be used to form a transistor in the peripheral region R2, and this transistor may include a transistor that can control the signal transmitting of the word lines 22 and/or the bit line structure BL, but not limited thereto. In some embodiments, the gate structure GS and the bit line structure BL can be formed together by performing the patterning process 90 to the multilayer stack structure 40, so as to achieve the effects of process simplification and process integration, but not limited thereto. In some embodiments of this invention, the gate structure disposed in the peripheral region R2 may also be formed by different processes and/or different materials according to other considerations. When the gate structure GS is formed by performing the patterning process 90 to the multilayer stack structure 40, the gate structure GS can include a second metal layer 43B, a second silicon layer 44B and a gate capping layer 45B. The gate capping layer 45B is disposed on the second metal layer 43B, and the second silicon layer 44B is disposed between the second metal layer 43B and the gate capping layer 45B in the perpendicular direction Z.

The second metal layer 43B, the second silicon layer 44B, and the gate capping layer 45B can be formed by performing the patterning process 90 to the metal layer 43, the silicon layer 44, and capping layer 45 in the multilayer stack structure 40 respectively. In addition, the multilayer stack structure 40 can further include a non-metallic conductive layer 41 and a barrier layer 42, the non-metallic conductive layer 41 is disposed between the metal layer 43 and the semiconductor substrate 10, and the barrier layer 42 is disposed between the non-metallic conductive layer 41 and the metal layer 43, but not limited thereto. In some embodiments of this invention, the abovementioned non-metallic conductive layer 41 and barrier layer 42 may not be disposed in the multilayer stack structure 40 according to other considerations. The non-metallic conductive layer 41 may include polysilicon, amorphous silicon or other non-metallic conductive materials that may contain silicon or not. The barrier layer 42 may include titanium, tungsten silicide (WSi), tungsten nitride (WN) or other suitable barrier materials.

When the bit line structure BL and the gate structure GS are formed by performing the patterning process 90 to the multilayer stack structure 40, the bit line structure BL can further include a first non-metallic conductive layer 41A and a first barrier layer 42A, and the gate structure GS can further include a second non-metallic conductive layer 41B and a second barrier layer 42B. The first non-metallic conductive layer 41A and the second non-metallic conductive layer 41B are formed by performing the patterning process 90 to the non-metallic conductive layer 41, and the first barrier layer 42A and the second barrier layer 42B are formed by performing the patterning process 90 to the barrier layer 42. Therefore, the first non-metallic conductive layer 41A is disposed between the first metal layer 43A and the semiconductor substrate 10, the second non-metallic conductive layer 41B is disposed between the second metal layer 43B and the semiconductor substrate 10, the first barrier layer 42A is disposed between the first non-metallic conductive layer 41A and the first metal layer 43A, and the second barrier layer 42B is disposed between the second non-metallic conductive layer 41B and the second metal layer 43B. Additionally, a gate dielectric layer 32 can be formed between the gate structure GS and the semiconductor substrate 10 for being used as the gate dielectric layer in the transistor corresponding to the gate structure GS.

Figure 3:
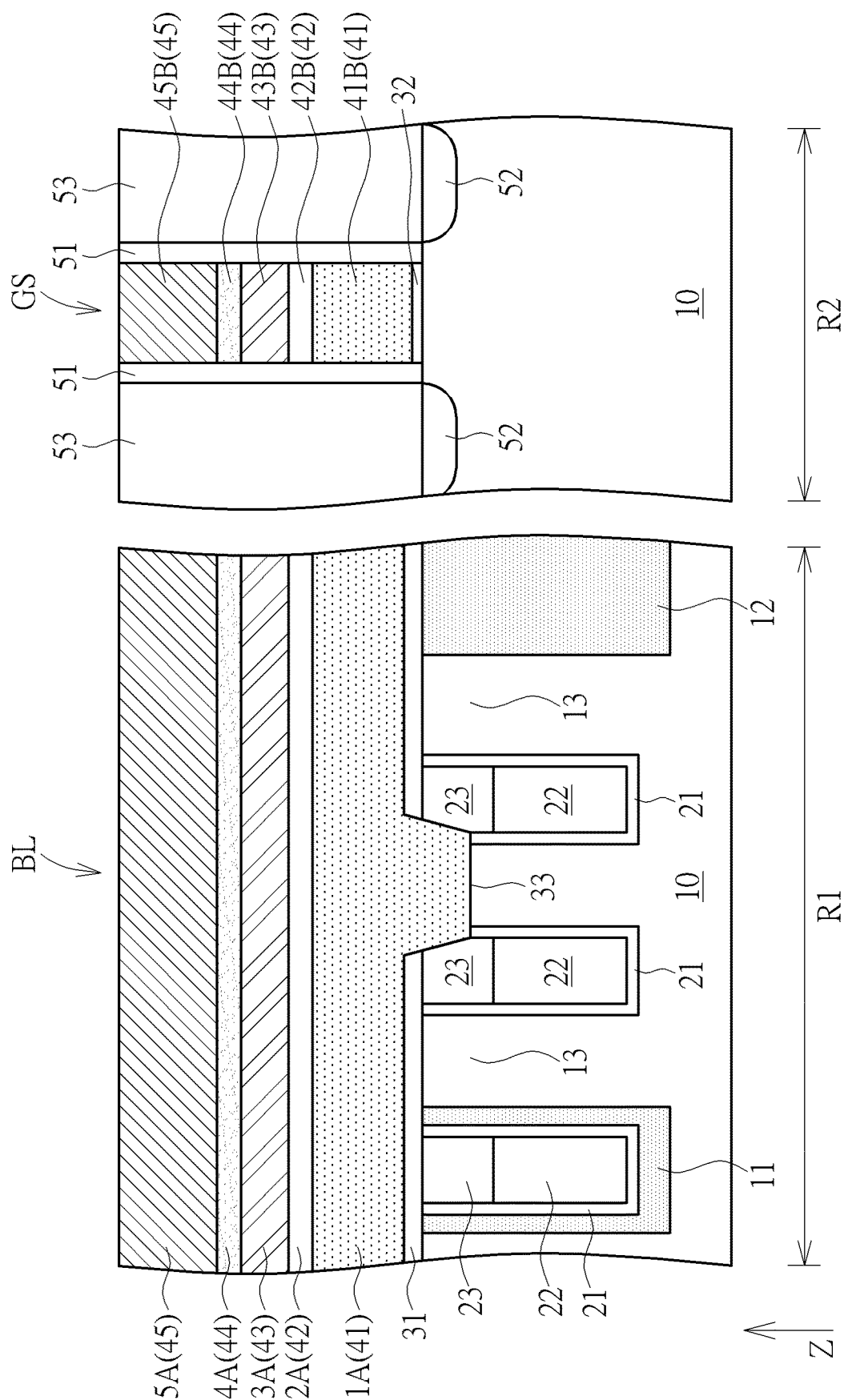
Figure 4:
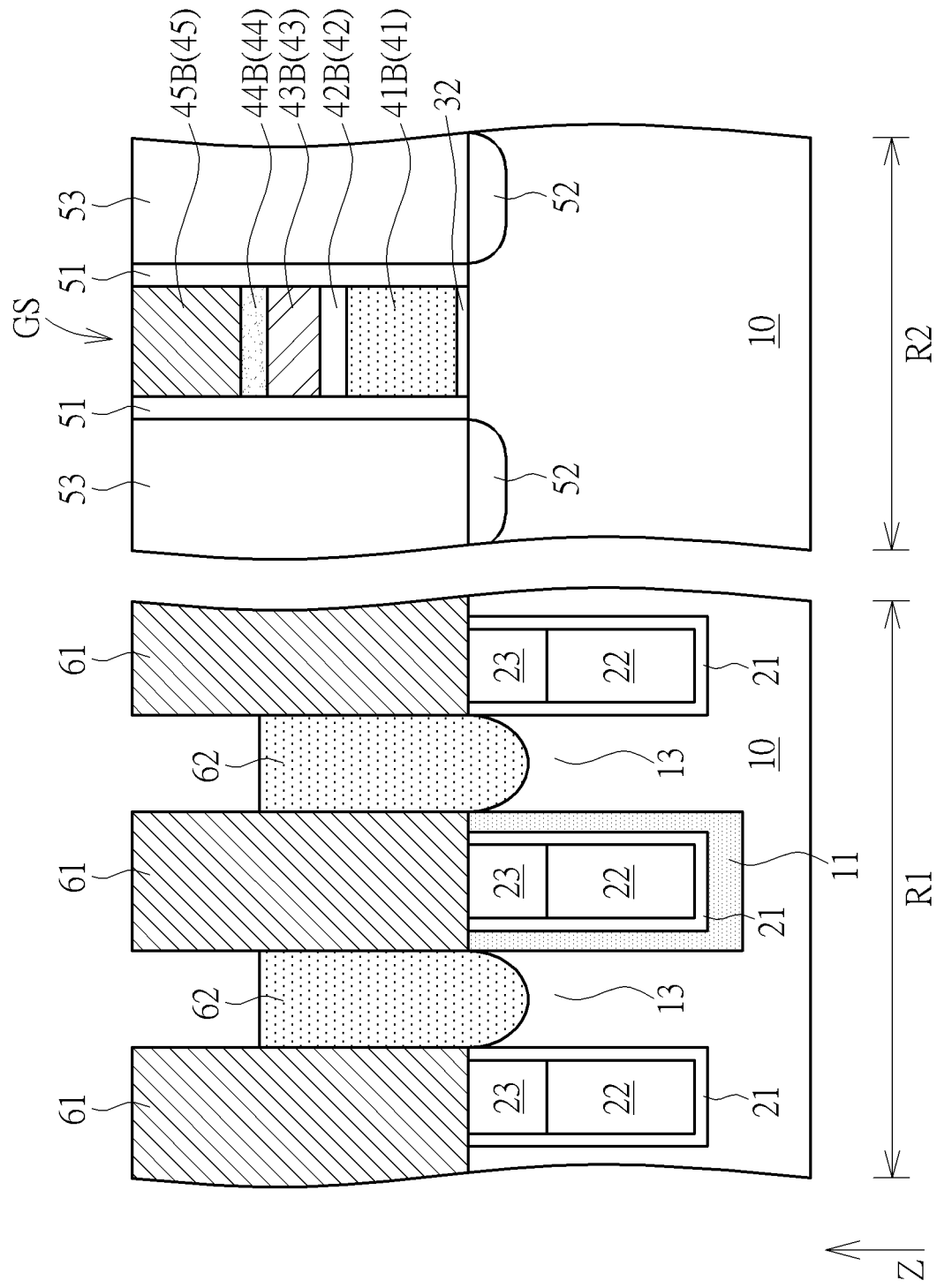

Next, as shown in FIG. 3, a spacer 51 can be formed on a sidewall of the gate structure GS in the peripheral region R2, the spacer 51 can be used for forming source/drain regions 52 in the semiconductor substrate 10 at two sides of the gate structure GS, and a dielectric layer 53 is formed next to cover the source/drain regions 52, but not limited thereto. In addition, as shown in FIG. 3 and FIG. 4, the manufacturing method of this embodiment may further include forming at least one storage node contact 62 on the semiconductor substrate 10 and in the memory cell region R1, and the storage node contact 62 is formed corresponding to and electrically connected to at least one of the active regions 13. The storage node contact 62 may be formed by forming an isolation structure 61 with a plurality of openings on the semiconductor substrate 10, filling the openings of the isolation structure 61 with a conductive material, and then performing an etching back process to the conductive material, so that a top surface of the storage node contact 62 is lower than a top surface of the isolation structure 61 in the perpendicular direction Z, and the top surface of the storage node contact 62 is higher than a top surface of the semiconductor substrate 10, but not limited thereto. The storage node contact 62 may include silicon, such as amorphous silicon, polysilicon or other silicon containing conductive material. However, in some embodiments, the storage node contact 62 may also be formed by other processes and/or materials according to other considerations.

Figure 5:
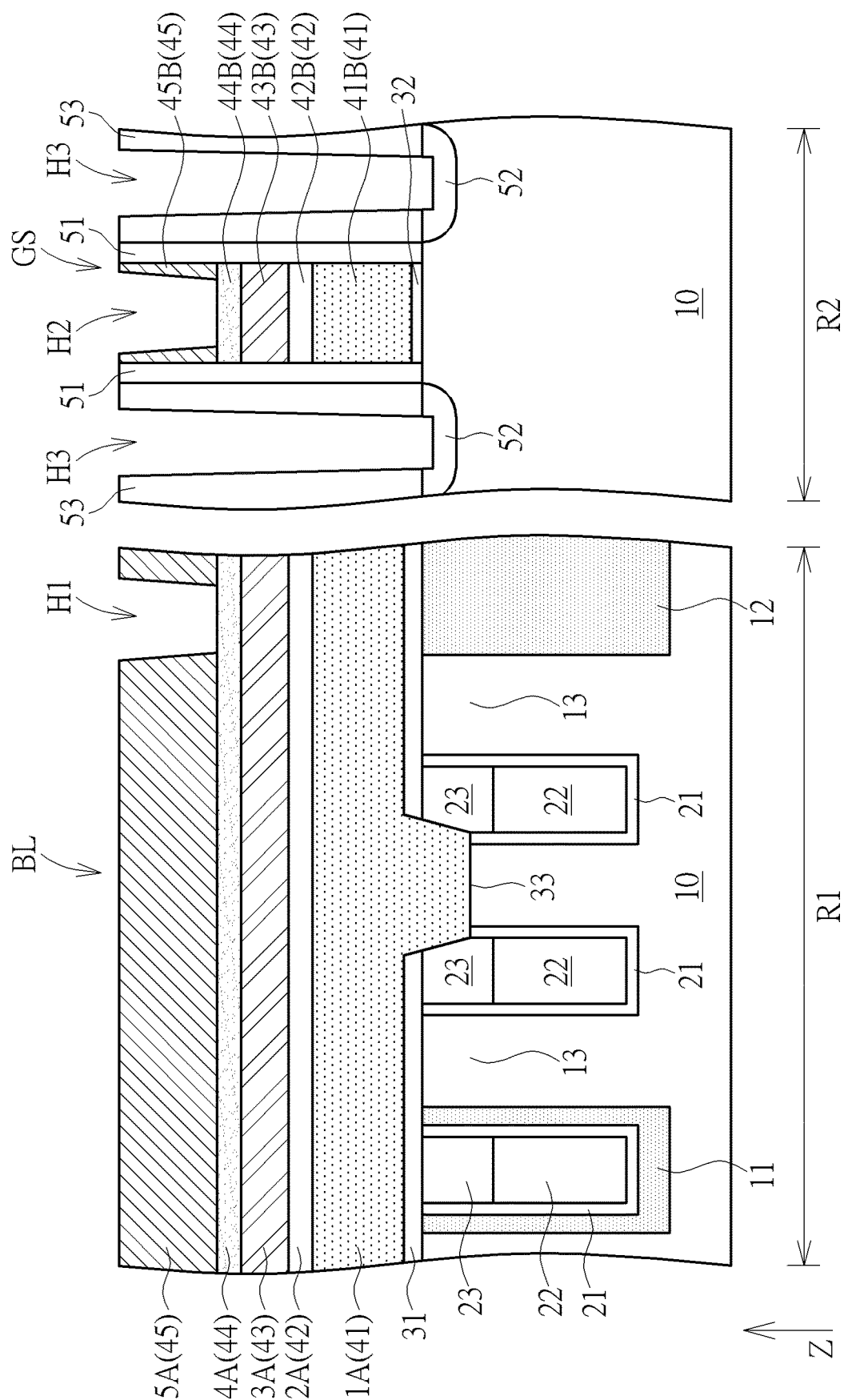

Next, as shown in FIG. 5, at least one bit line contact opening H1 is formed, and the bit line contact opening H1 penetrates the bit line capping layer 45A and exposes a portion of the first silicon layer 44A. In addition, agate contact opening H2 and two source/drain contact openings H3 can be formed in the peripheral region R2. The gate contact opening H2 penetrates the gate capping layer 45B and exposes at least a portion of the second silicon layer 44B, and each source/drain contact opening H3 penetrates the dielectric layer 53 and exposes the corresponding source/drain region 52. The abovementioned bit line contact opening H1, gate contact opening H2, and source/drain contact openings H3 can be formed by an etching process with the same patterned mask, so as to achieve the effect of process simplification, but not limited thereto. In some embodiments, the bit line contact opening H1, the gate contact opening H2, and the source/drain contact openings H3 may also be formed respectively by different patterned masks and/or etching processes.

Figure 6:
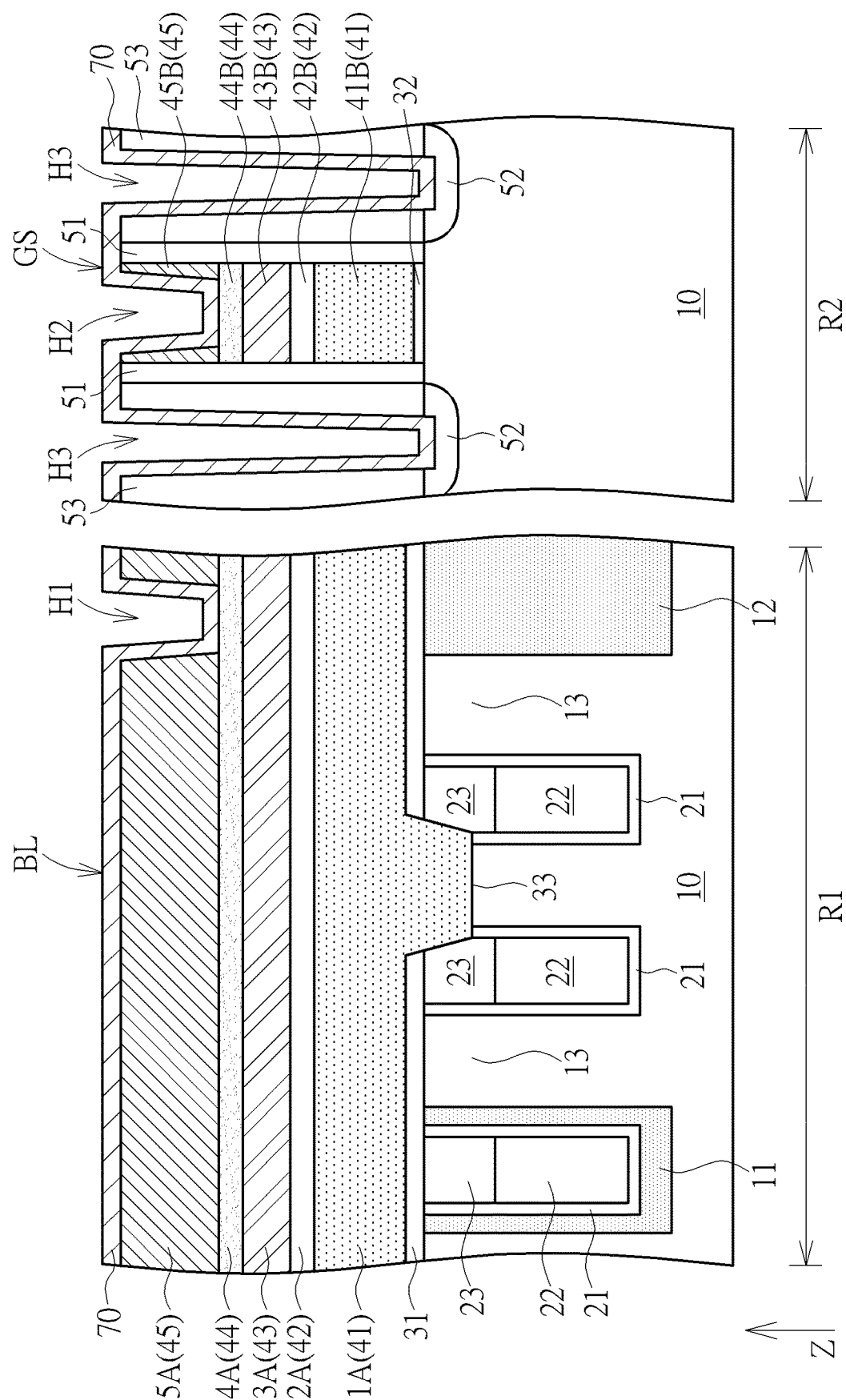
Figure 7:
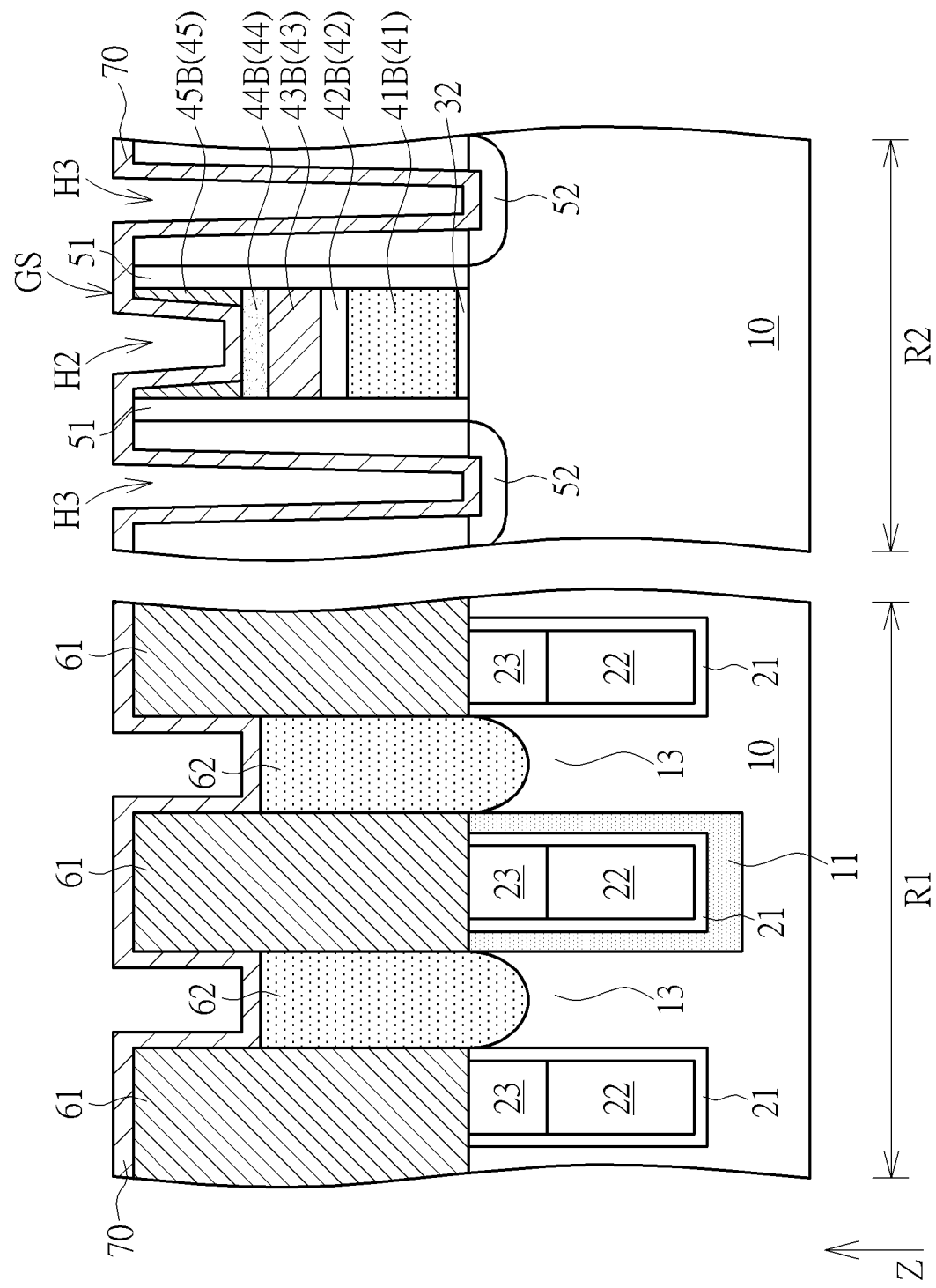
Figure 8:
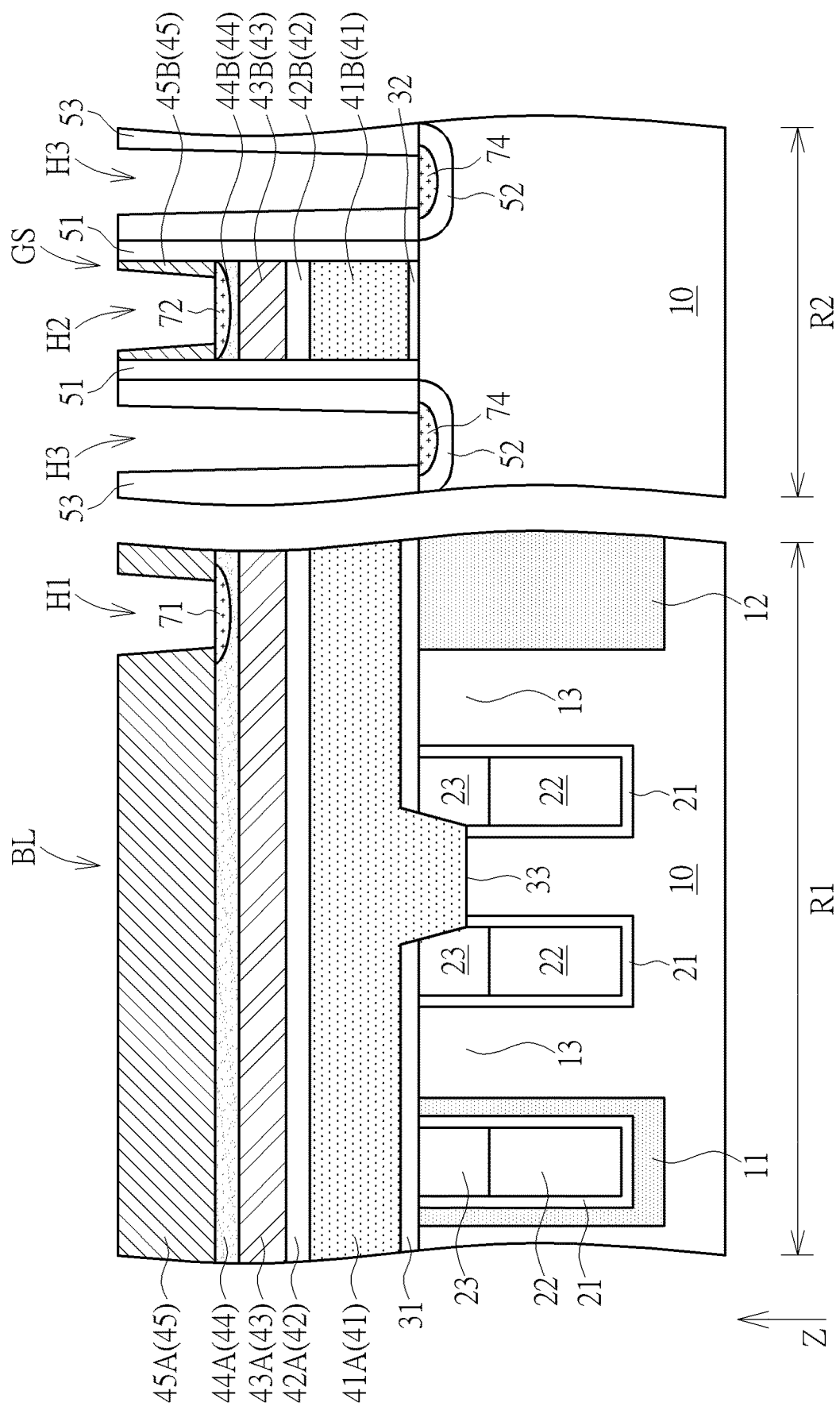
Figure 9:
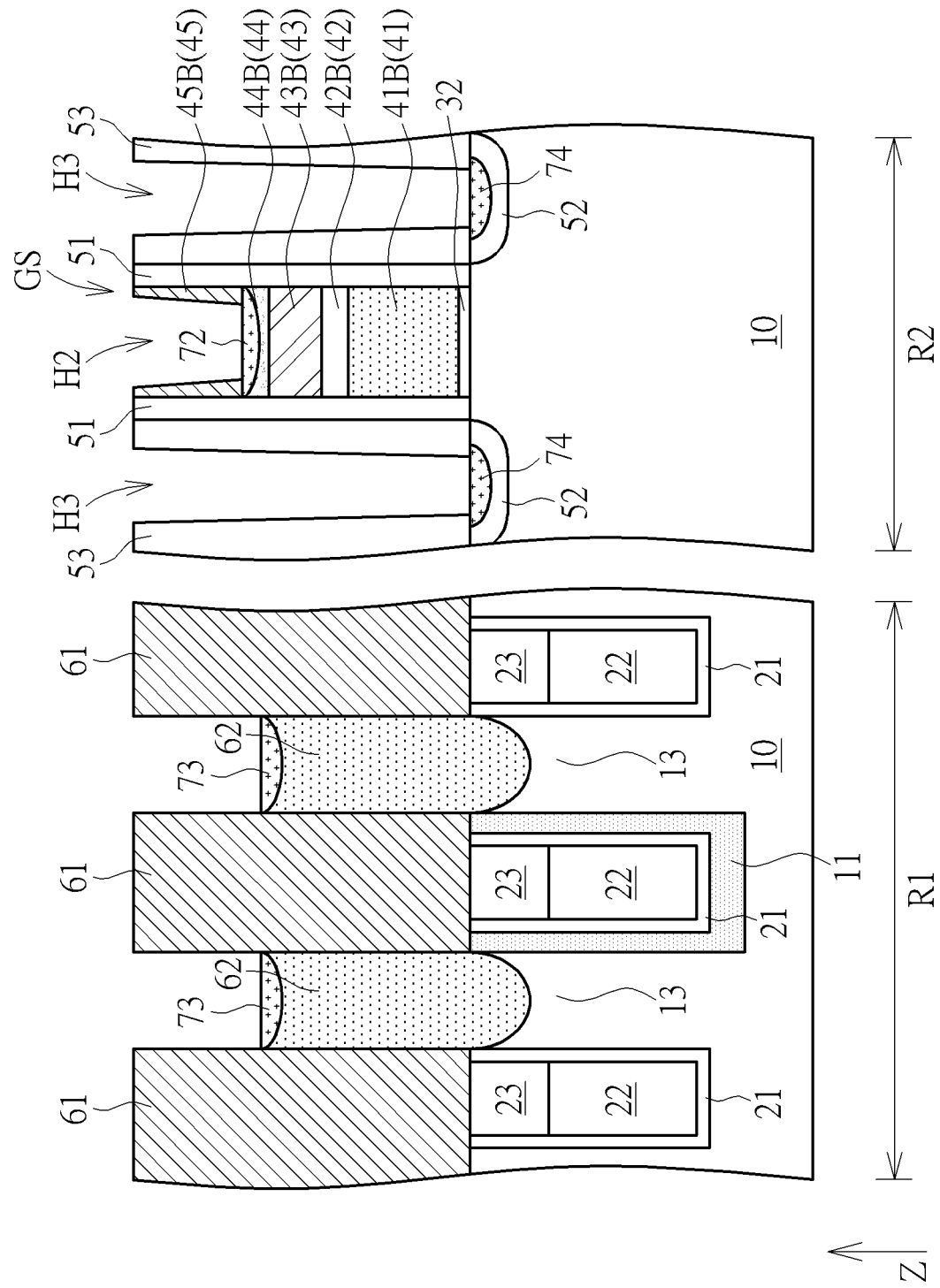

Next, as shown in FIG. 6 to FIG. 9, a first metal silicide layer 71 is formed on the portion of the first silicon layer 44A exposed by the bit line contact opening H1. The method of forming the bit line structure BL in this embodiment can include but not limited to the following steps. As shown in FIG. 6 and FIG. 8, an auxiliary metal layer 70 is formed on the semiconductor substrate 10 first. The auxiliary metal layer 70 is at least partially formed on the portion of the first silicon layer 44A exposed by the bit line contact opening H1. Then, a thermal treatment is performed to form the first metal silicide layer 71 on the portion of the first silicon layer 44A exposed by the bit line contact opening H1, and the auxiliary metal layer 70 is removed after the first metal silicide layer 71 is formed. In some embodiments, the auxiliary metal layer 70 may include cobalt (Co), nickel (Ni) or other suitable metal materials, and the first metal silicide layer 71 may include cobalt-silicide, nickel-silicide or other suitable metal silicide. In addition, the manufacturing method of this embodiment may further include forming a second metal silicide layer 72 on the portion of the second silicon layer 44B exposed by the gate contact opening H2. In some embodiments, a material of the second metal silicide layer 72 and a material of the first metal silicide layer 71 are the same, and the second metal silicide layer 72 and the first metal silicide layer 71 can be formed together by the same process, so as to achieve the effect of process simplification, but not limited thereto. For example, the auxiliary metal layer 70 can be partially formed on the portion of the second silicon layer 44B exposed by the gate contact opening H2, and the second metal silicide layer 72 can be formed on the second silicon layer 44B by the thermal treatment. Additionally, in some embodiments, a different process may also be performed to form the second metal silicide layer 72 that is different from the first metal silicide layer 71 according to other considerations.

As shown in FIG. 6 to FIG. 9, the manufacturing method of this embodiment can further include forming a third metal silicide layer 73 on the storage node contact 62. In some embodiments, a material of the third metal silicide layer 73 and a material of the first metal silicide layer 71 can be the same, and the third metal silicide layer 73 and the first metal silicide layer 71 can be formed together by the same process, so as to achieve the effect of process simplification, but not limited thereto. For example, the auxiliary metal layer 70 can be partially formed on the storage node contact 62, and the third metal silicide layer 72 can be formed on the storage node contact 62 by the thermal treatment. However, in some embodiments, a different process may also be performed to form the third metal silicide layer 73 that is different from the first metal silicide layer 71 according to other considerations. In addition, the auxiliary metal layer 70 is removed after the first metal silicide layer 71 and the third metal silicide layer 73 are formed. It is noteworthy that the first metal layer 43A of the bit line structure BL is completely covered by the first silicon layer 44A and/or the first metal silicide layer 71 in the perpendicular direction Z when removing the auxiliary metal layer 70. Therefore, the first metal layer 43A is protected from being damaged by the process of removing the auxiliary metal layer 70. Additionally, the second metal layer 43B of the gate structure GS is completely covered by the second silicon layer 44A and/or the second metal silicide layer 72 in the perpendicular direction Z when removing auxiliary metal layer 70. Therefore, the second metal layer 43B can be protected from being damaged by the process of removing the auxiliary metal layer 70. In addition, since the main purpose of forming the silicon layer 44 is protecting the metal layer 43 and forming the metal silicide layer, the thickness of the silicon layer 44 can be adjusted according to the silicon consumption in the process of forming the metal silicide. Therefore, the thicknesses of the first silicon layer 44A and the second silicon layer 44B are preferably less than the thicknesses of the first non-metallic conductive layer 41A and the second non-metallic conductive layer 41B, but not limited thereto.

In addition, the manufacturing method of this embodiment can further include forming a fourth metal silicide layer 74 on the source/drain region 52 exposed by the source/drain contact opening H3. In some embodiments, a material of the fourth metal silicide layer 74 and a material of the second metal silicide layer 72 can be the same, and the fourth metal silicide layer 74, the first metal silicide layer 71, the second metal silicide layer 72, and the third metal silicide layer 73 can be formed together by the same process, so as to achieve the effect of process simplification, but not limited thereto.

Figure 10:
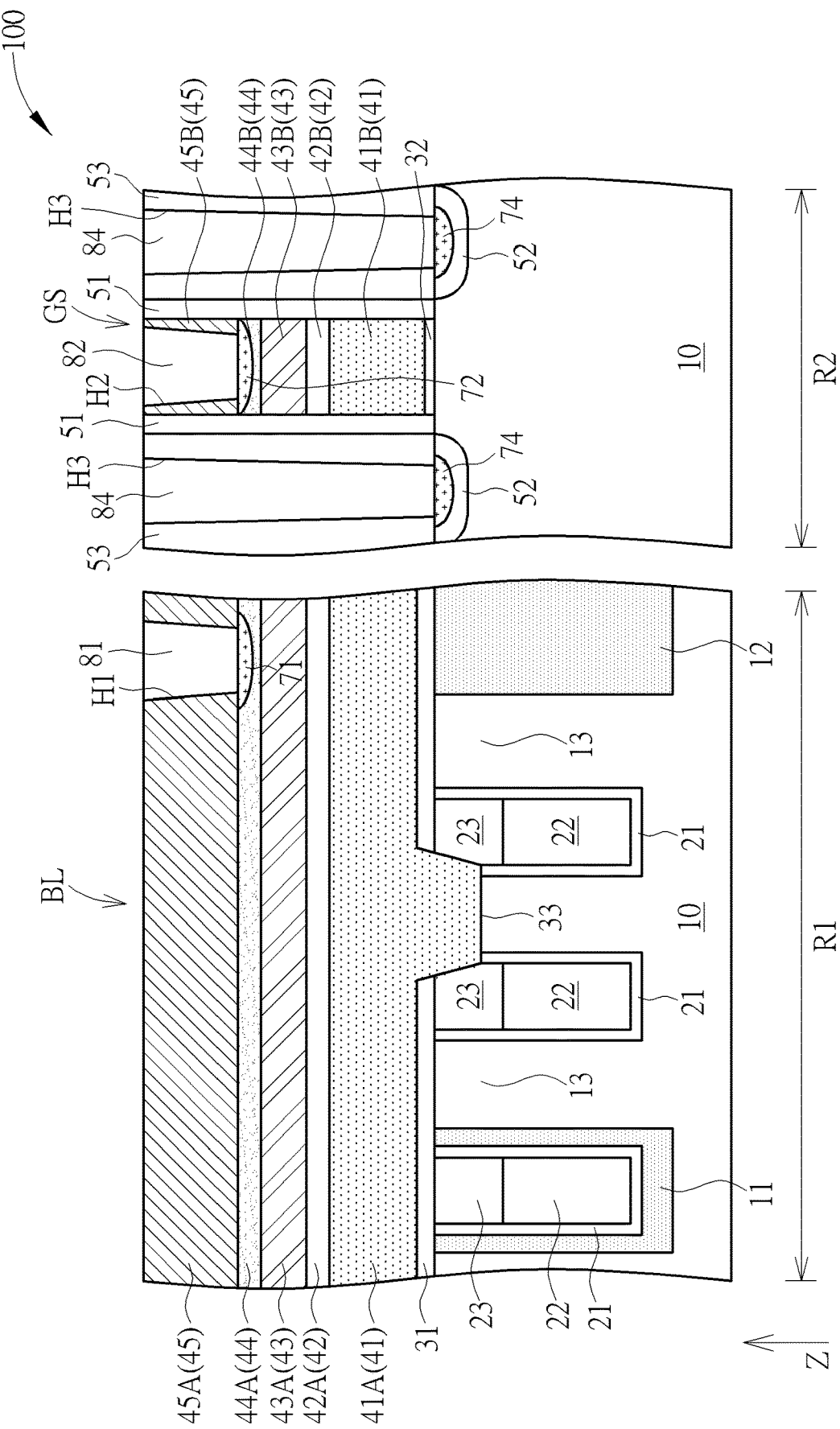
Figure 11:
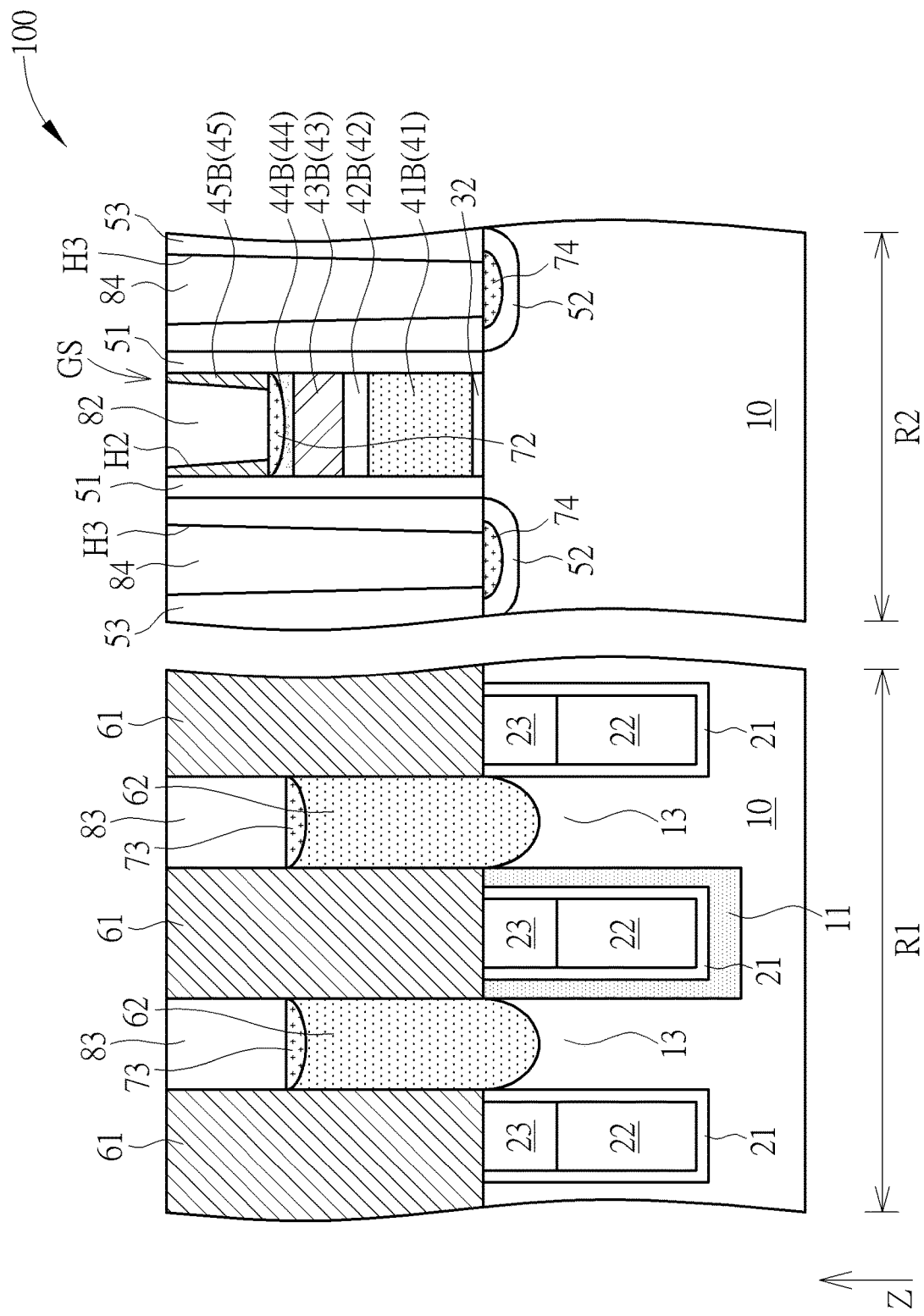

Next, as shown in FIG. 10 and FIG. 11, a bit line contact structure 81 is formed in the bit line contact opening H1, and the bit line contact structure 81 contacts the first metal silicide layer 71 for being electrically connected to the bit line structure BL. The bit line contact structure 81 may include a conductive material with low resistance, such as aluminum, tungsten, copper, titanium aluminide, or the like. A barrier layer (not shown) may further be formed between the low resistance conductive material and the first metal silicide layer 71, and this barrier layer may include single layer or multilayer barrier layer structure and may include titanium, titanium nitride (TiN) or other suitable barrier materials. In addition, the manufacturing method of this embodiment can further include forming a gate contact structure 82 in the gate contact opening H2, forming a contact structure 83 on the third metal silicide layer 73, and forming a source/drain contact structure 84 in the source/drain contact opening H3. The gate contact structure 82 contacts the second metal silicide layer 72 for being electrically connected to the gate structure GS. The contact structure 83 contacts the third metal silicide layer 73 for being electrically connected to the storage node contact 62. The source/drain contact structure 84 contacts the fourth metal silicide layer 74 for being electrically connected to the source/drain region 52. In some embodiments, the bit line contact structure 81, the gate contact structure 82, the contact structure 83, and the source/drain contact structure 84 can be the same material and/or can be formed by the same process, so as to achieve the effect of process simplification, but not limited thereto.

According to the abovementioned manufacturing method, a semiconductor memory device 100 shown in FIG. 10 and FIG. 11 can be formed. The semiconductor memory device 100 of this embodiment includes the semiconductor substrate 10, at least one bit line structure BL, at least one bit line contact opening H1, the first metal silicide layer 71, and the bit line contact structure 81. The bit line structure BL is disposed on the semiconductor substrate 10, and the bit line structure BL includes the first metal layer 43A, the bit line capping layer 45A, and the first silicon layer 44A. The bit line capping layer 45A is disposed on the first metal layer 43A, and the first silicon layer 44A is disposed between the first metal layer 43A and the bit line capping layer 45A. The bit line contact opening H1 penetrates the bit line capping layer 45A, the first metal silicide layer 71 is disposed on the first silicon layer 44A corresponding to the bit line contact opening H1, and the bit line contact opening H1 exposes at least a portion of the first metal silicide layer 44A. The bit line contact structure 81 is disposed in the bit line contact opening H1, and the bit line contact structure 81 contacts the first metal silicide layer 71 for being electrically connected to the bit line structure BL. The bit line structure BL is at least partially disposed in the memory cell region R1, and the semiconductor memory device 100 further includes the gate structure GS, at least one gate contact opening H2, the second metal silicide layer 72, and the gate contact structure 82. The gate structure GS is disposed on the semiconductor substrate 10 and disposed in the peripheral region R2, the gate structure GS includes the second metal layer 43B, the second silicon layer 44B, and the gate capping layer 45B. The gate capping layer 45B is disposed on the second metal layer 43B, and the second silicon layer 44B is disposed between the second metal layer 43B and the gate capping layer 45B. The gate contact opening H2 penetrates the gate capping layer 45B, the second metal silicide layer 72 is disposed on the second silicon layer 44B corresponding to the gate contact opening H2, and the gate contact opening H2 exposes at least a portion of the second metal silicide layer 72. The gate contact structure 82 is disposed in the gate contact opening H2, and the gate contact structure 82 contacts the second metal silicide layer 72 for being electrically connected to the gate structure GS.

In addition, as shown in FIG. 10 and FIG. 11, the semiconductor memory device 100 can further include at least one storage node contact 62, at least one third metal silicide layer 73 and the contact structure 83. The storage node contact 62 is disposed on the semiconductor substrate 10, and the storage node contact 62 is disposed corresponding to and electrically connected to at least one of the active regions 13. The third metal silicide layer 73 is disposed on the storage node contact 62, the contact structure 82 is disposed on the third metal silicide layer 73, and the contact structure 82 contacts the third metal silicide layer 73 for being electrically connected to the storage node contact 62. The first silicon layer 44A is disposed between the first metal layer 43A and the bit line capping layer 45A in the bit line structure BL, and thereby the first silicon layer 44A can protect the first metal layer 43A from being damaged by the process of forming the third metal silicide layer 73 on the storage node contact 62. Accordingly, advantages of improving the electrical performance and increasing the product yield of the semiconductor memory device 100 can be obtained.

To sum up the semiconductor memory device and the manufacturing method thereof in this present invention, the first silicon layer is disposed on the first metal layer in the bit line structure, and the first silicon layer can be used to protect the first metal layer from being damaged by the process of forming the metal silicide layer on the storage node contact. In addition, the gate structure disposed in the peripheral region and the bit line structure can be formed together by performing the patterning process to the same multilayer stack structure, so that the second silicon layer can also be disposed on the second metal layer in the gate structure for protecting the second metal layer from being damaged by the process of forming the metal silicide layer on the storage node contact.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor memory device, comprising:
a semiconductor substrate;
at least one bit line structure disposed on the semiconductor substrate, the bit line structure comprising:
a first metal layer;

a bit line capping layer disposed on the first metal layer; and a first silicon layer disposed between the first metal layer and the bit line capping layer;

at least one bit line contact opening penetrating the bit line capping layer;

a first metal silicide layer disposed on the first silicon layer corresponding to the bit line contact opening, wherein the bit line contact opening exposes at least a portion of the first metal silicide layer; and a bit line contact structure disposed in the bit line contact opening, wherein the bit line contact structure contacts the first metal silicide layer for being electrically connected to the bit line structure.

2. The semiconductor memory device according to claim 1, wherein a memory cell region and a peripheral region are defined on the semiconductor substrate, the bit line structure is at least partially disposed in the memory cell region, and the semiconductor memory device further comprises:

a gate structure disposed on the semiconductor substrate and disposed in the peripheral region, the gate structure comprising:

a second metal layer;

a gate capping layer disposed on the second metal layer; and a second silicon layer disposed between the second metal layer and the gate capping layer.

3. The semiconductor memory device according to claim 2, further comprising:

at least one gate contact opening penetrating the gate capping layer;

a second metal silicide layer disposed on the second silicon layer corresponding to the gate contact opening, wherein the gate contact opening exposes at least a portion of the second metal silicide layer; and a gate contact structure disposed in the gate contact opening, wherein the gate contact structure contacts the second metal silicide layer for being electrically connected to the gate structure.

4. The semiconductor memory device according to claim 3, wherein a material of the first metal silicide layer and a material of a second metal silicide layer are the same.

5. The semiconductor memory device according to claim 1, further comprising:

at least one storage node contact disposed on the semiconductor substrate, wherein the semiconductor substrate comprises a plurality of active regions, and the storage node contact is disposed corresponding to and electrically connected to at least one of the active regions;

at least one third metal silicide layer disposed on the storage node contact; and a contact structure disposed on the third metal silicide layer, wherein the contact structure contacts the third metal silicide layer for being electrically connected to the storage node contact.

6. The semiconductor memory device according to claim 5, wherein a material of the first metal silicide layer and a material of the third metal silicide layer are the same.

* * * * *